(12) United States Patent
Verschueren et al.

(10) Patent No.: US 7,121,204 B2
(45) Date of Patent: Oct. 17, 2006

(54) METHOD OF LITHOGRAPHIC PRINTING WITHOUT DAMPENING LIQUID

(75) Inventors: Eric Verschueren, Merksplas (BE); Rudi Goedeweeck, Rotselaar (BE); Joan Vermeersch, Deinze (BE)

(73) Assignee: Agfa Gevaert, Mortsel (BE)

( * ) Notice: Subject to any disclaimer, the term of this patent is extended or adjusted under 35 U.S.C. 154(b) by 0 days.

(21) Appl. No.: 10/175,755

(22) Filed: Jun. 20, 2002

(65) Prior Publication Data

US 2003/0010240 A1    Jan. 16, 2003

Related U.S. Application Data

(60) Provisional application No. 60/307,497, filed on Jul. 24, 2001.

(30) Foreign Application Priority Data

Jun. 21, 2001    (EP) .................................. 01000247

(51) Int. Cl.
*B41F 5/00* (2006.01)
*B41N 3/00* (2006.01)

(52) U.S. Cl. .................. 101/450.1; 101/147; 101/465; 430/302; 430/309

(58) Field of Classification Search ................ 101/147, 101/148, 450.1, 451, 452, 463.1, 465, 466, 101/467; 430/302, 303, 309, 310, 325
See application file for complete search history.

(56) References Cited

U.S. PATENT DOCUMENTS

| | | | | |
|---|---|---|---|---|
| 4,718,340 A | * | 1/1988 | Love, III ...................... | 101/116 |
| 5,148,746 A | * | 9/1992 | Fuller et al. ................. | 101/142 |
| 5,658,713 A | * | 8/1997 | Van Hunsel et al. ........ | 430/331 |
| 5,778,789 A | * | 7/1998 | Krishnan et al. ........ | 101/450.1 |
| 6,030,750 A | * | 2/2000 | Vermeersch et al. ........ | 430/302 |
| 6,124,079 A | * | 9/2000 | Vermeersch et al. ........ | 430/303 |
| 6,138,566 A | * | 10/2000 | Sakamoto ................. | 101/463.1 |
| 6,140,392 A | * | 10/2000 | Kingman et al. ........... | 523/160 |
| 6,186,067 B1 | * | 2/2001 | Rorke et al. ................. | 101/467 |
| 6,196,129 B1 | * | 3/2001 | Kellett ........................ | 101/467 |
| 6,242,159 B1 | | 6/2001 | Firth et al. | |
| 6,245,481 B1 | * | 6/2001 | Teng ........................ | 430/270.1 |
| 6,336,404 B1 | * | 1/2002 | Sakamoto ................. | 101/463.1 |
| 6,374,738 B1 | * | 4/2002 | Lewis et al. ................. | 101/467 |
| 2002/0072013 A1 | * | 6/2002 | Vander Aa ................... | 430/302 |
| 2002/0104454 A1 | * | 8/2002 | Verschueren ............. | 101/450.1 |

FOREIGN PATENT DOCUMENTS

EP    0832739 A1    4/1998

(Continued)

*Primary Examiner*—Andrew H. Hirshfeld
*Assistant Examiner*—Jill E. Culler
(74) *Attorney, Agent, or Firm*—Leydig, Voit & Mayer, Ltd

(57) ABSTRACT

A method of printing is disclosed which comprises the steps of
(i) providing a lithographic printing plate precursor comprising a support and a heat- or light-sensitive coating;
(ii) image-wise exposure of the coating to heat or light;
(iii) prior to step (ii) or (iv), mounting the lithographic printing plate precursor in a printing unit of a printing press, said printing unit comprising a dampening system and an inking system;
(iv) development by supplying a processing liquid to the coating by means of the dampening system, thereby obtaining a lithographic printing plate;
(v) printing by supplying single-fluid ink or driographic ink to the lithographic printing plate by means of the inking system.
This method allows on-press processing of printing plate materials that require wet processing.

18 Claims, 1 Drawing Sheet

FOREIGN PATENT DOCUMENTS

| | | |
|---|---|---|
| EP | 0993945 A1 | 4/2000 |
| EP | 1022133 A1 | 7/2000 |
| WO | WO 9401280 A | 1/1994 |
| WO | WO 0119613 A | 3/2001 |

\* cited by examiner

METHOD OF LITHOGRAPHIC PRINTING WITHOUT DAMPENING LIQUID

CROSS-REFERENCE TO RELATED PATENT APPLICATIONS

This patent application claims the benefit of U.S. Provisional Patent Application No. 60/307,497, filed Jul. 24, 2001.

FIELD OF THE INVENTION

The present invention relates to a method of lithographic printing wherein a lithographic printing plate precursor is developed with a processing liquid while said plate precursor is mounted in a printing press.

BACKGROUND OF THE INVENTION

Lithographic printing presses use a so-called printing master such as a printing plate that is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

In recent years the so-called 'computer-to-plate' (CTP) method has gained a lot of interest. This method, also called 'direct-to-plate', bypasses the creation of film because the digital document is transferred directly to a plate precursor by means of a so-called plate-setter. A special type of CTP involves the exposure of a plate precursor while being mounted on a plate cylinder of a printing press by means of a plate-setter that is integrated in the press. This method may be called 'computer-to-press' and printing presses with an integrated plate-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364. Besides the immediate registration of the plates in a multi-color press, computer-to-press methods offer the additional benefit that the plate does not need to be handled after exposure and processing and, as a result, that it is not necessary to apply a so-called desensitizing coating (gum layer) to protect the developed plate against fingerprints or other contamination.

Especially thermal plates, which are sensitive to heat or infrared light, are widely used in computer-to-plate and computer-to-press methods because of their daylight stability. Such thermal materials preferably comprise a compound that converts absorbed light into heat. The heat, which is generated on image-wise exposure, triggers a (physico-) chemical process, such as ablation, polymerization, insolubilization by cross-linking of a polymer, decomposition, or particle coagulation of a thermoplastic polymer latex, and after optional processing, a lithographic image is obtained. Thermal plate materials, which are often used in computer-to-press methods, are based on heat-induced ablation. A problem associated with ablative plates is the generation of debris that is difficult to remove and may disturb the printing process or may contaminate the exposure optics of the integrated image-setter. As a result, such ablative plates require a processing step for removing the debris from the exposed material.

A non-ablative plate which can be developed with fountain and ink is described in EP-B 770 494. The latter patent specification discloses a method wherein an imaging material comprising an image-recording layer of a hydrophilic binder, a compound capable of converting light to heat and hydrophobic thermoplastic polymer particles, is image-wise exposed, thereby converting the exposed areas into an hydrophobic phase which define the printing areas of the printing master. The press run can be started immediately after exposure without any additional treatment because the layer is developed by interaction with the fountain and ink that are supplied to the cylinder during the press run. So the wet chemical processing of these materials is 'hidden' to the user and accomplished during the first runs of the printing press. A problem associated with such non-ablative, hidden-processing materials is the low run length of the plate.

Other thermal plates, e.g. Agfa's Thermostar™ or Electra™ from Kodak Polychrome Graphics, provide a longer run length but require wet processing with alkaline liquids which may damage or contaminate the electronics and optics of the integrated image-setter and other devices of a digital printing press. Also UV-sensitive plates would be very suitable for CTP because of their potential stability in visible or yellow light. In addition, most conventional UV-sensitive, so-called pre-sensitized ("PS") plates, which are normally used for contact exposure through a film mask, enable a very high run length in addition to other benefits such as high speed, resistance to press chemicals, and better physical resistance, e.g. towards scratching, than typical thermal plates. However, such PS plates also require alkaline processing, which makes them less suitable for on-press processing as required in computer-to-press methods. Such plates are therefore usually developed in a dedicated processing apparatus and then mounted on the press. This requires quite some plate-handling during mounting and registering of the plates and therefore involves a risk of scratches, fingerprints or other damage or contamination of the lithographic image.

So there is a need for a wet processing method which can be performed while the imaging material is mounted in a printing press, without the risk of damaging or contaminating nearby electro-optical components. Such a processing method opens computer-to-press systems to plates that require wet processing but on the other hand are characterized by benefits such as a long run length or daylight stability.

SUMMARY OF THE INVENTION

It is an object of the present invention to provide a method of wet processing which can be carried out on a lithographic printing plate precursor, wherein the risk of damaging or contaminating nearby electronic and optical components is minimized. This object is realized by a method of printing which comprises the steps of:

(i) providing a lithographic printing plate precursor comprising a support and a heat- or light-sensitive coating;
(ii) image-wise exposure of the coating to heat or light;
(iii) prior to step (ii) or (iv), mounting the lithographic printing plate precursor in a printing unit of a printing press, said printing unit comprising a dampening system and an inking system;
(iv) development by supplying a processing liquid to the coating by means of the dampening system, thereby obtaining a lithographic printing plate;
(v) printing by supplying single-fluid ink or driographic ink to the lithographic printing plate by means of the inking system.

Preferred embodiments are defined in the dependent claims. According to a method of the present invention, a lithographic printing plate precursor is processed on-press by supplying a processing liquid by means of the dampening system that is present in any press for wet lithography. After processing, printing is started as usual, but instead of feeding oily ink as well as an aqueous dampening liquid to the plate, a driographic ink or a single-fluid ink is supplied to the plate by the inking system. The use of driographic ink or single-fluid ink during printing makes it possible to employ the dampening rollers as a processing system for on-press development of plate materials that require wet or even alkaline processing. This method provides the additional advantage that the processing liquid is not capable of contaminating the ink that is supplied during the printing step, since it is not required to engage the dampening system during printing.

Driographic ink is especially optimized for printing from plates wherein the non-image areas are defined by a surface that contains a silicone or a fluorinated polymer. Such areas are highly oleophobic so that printing from the oleophilic image-areas is possible without using a dampening liquid. Driographic inks are high in both tack and viscosity, preferably over a wide temperature range.

Single-fluid ink is generally understood as an ink that is an emulsion of an ink phase in a polar phase, or vice-versa, an emulsion of a polar phase in an ink phase. Single-fluid ink allows printing with a conventional printing master for wet lithography without the application of a dampening liquid. The ink phase adsorbs onto the hydrophobic areas of the printing master and the polar phase wets the hydrophilic areas, thereby preventing adsorption of the ink component on the non-printing portions of the lithographic image without the requirement of supplying a separate dampening solution.

According to the present invention, the lithographic printing plate precursor can be exposed on- or off-press. In the latter embodiment, the plate precursor is exposed in a plate-setter, then mounted on a printing press and subsequently developed by supplying a processing liquid via the dampening system. More preferably, the unexposed plate precursor is mounted on the press and then exposed by an integrated plate-setter and subsequently developed by supplying a processing liquid via the dampening system.

Other objects of the invention and preferred embodiments will be discussed below.

DETAILED DESCRIPTION OF THE INVENTION

The Lithographic Printing Plate Precursor

Figure 1:
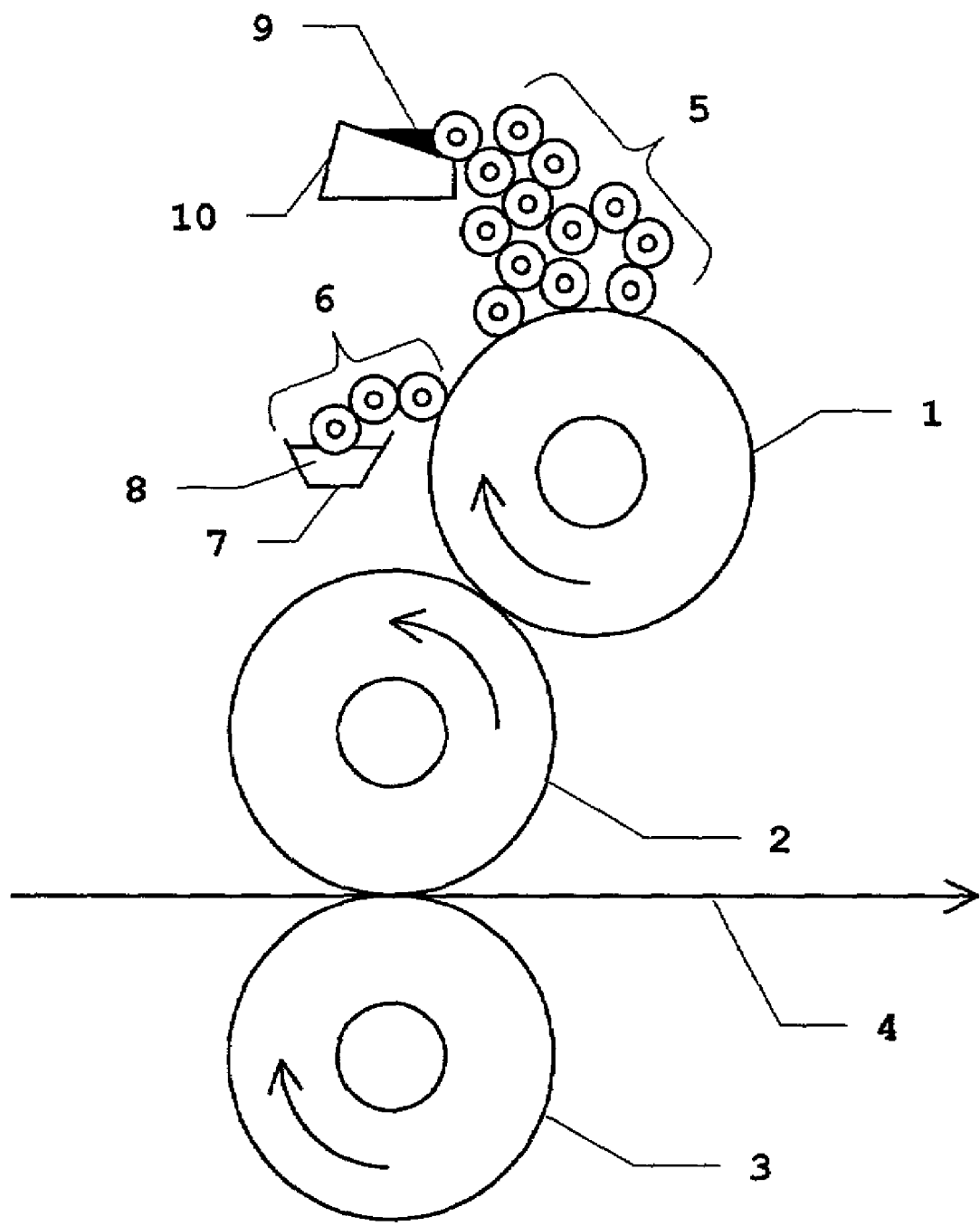
FIG. 1 is a schematic, lateral view of a printing unit of a rotary printing press for wet lithography.

The lithographic printing plate precursor used in the present invention is an imaging material that comprises a support and a heat- or light-sensitive coating, which may consist of one or more layer(s) provided on the support. The material forms a latent image upon image-wise exposure, preferably without substantially ablating the coating, i.e. without removing an amount of substances from the coating by ablation during the exposure that would be sufficient to create a useful image before the wet development step. The latent image consists of areas in the coating from which substances can be removed by the processing liquid and other areas from which these substances are not removed in the development step.

A preferred imaging material is a lithographic printing plate precursor which can form a lithographic image consisting of two sets of areas which have opposite affinity towards ink or an ink-abhesive fluid (i.e. hydrophilic and hydrophobic areas or oleophilic and oleophobic). Such a lithographic image can be obtained after a wet development step wherein a layer having a first affinity towards ink or an ink-abhesive fluid is removed from the material and thereby another layer, or the support, is revealed which has the opposite affinity towards ink or an ink-abhesive fluid. The methods of the present invention are suitable for removing ablation debris from the exposed printing plate precursor, wherein it may suffice to use water as a processing liquid. In a more preferred embodiment, the printing plate precursor is non-ablative, i.e. the material shows no substantial ablation of one or more layer(s) upon exposure. "No substantial ablation" means that no useful lithographic image is formed after exposure by ablative removal of a layer. Instead, the preferred plate precursors used in the present invention form a useful lithographic image only after removal of exposed or non-exposed areas of the coating by means of a wet development step.

The imaging material comprises at least one image-recording layer provided on a support. Preferably, only a single imaging layer is provided on the support. The material can be negative or positive working, i.e. can form ink-accepting areas at exposed or at non-exposed areas respectively. In a preferred positive working embodiment, the material contains a layer which is ink-accepting and not removable by the processing liquid before exposure and which is rendered removable upon exposure, so that an underlying hydrophilic layer or support is revealed at exposed areas after processing. In a preferred negative working embodiment, the material contains a layer which is removable by the development step at non-exposed areas and which is converted to a non-removable state by the exposure, so that an underlying hydrophilic layer or a hydrophilic support is revealed by the development step at non-exposed areas and an ink-accepting layer remains after the processing at exposed areas. The term "removed" or "removable" indicates that substances are or can be removed from the coating by the supply of the processing liquid by dissolution of said substances in the liquid or by the formation of a suspension, dispersion or emulsion of said substances in the liquid.

Highly preferred but non-limiting embodiments of suitable imaging materials contain a hydrophilic support and a coating provided thereon which is hydrophobic or is converted to a hydrophobic state upon exposure. Such materials can be provided by coating, spraying, or jetting an image-recording layer on a support while it is mounted in a printing press or plate-setter. Or the end-user may mount a ready-made imaging material, supplied by a plate manufacturer, on the press or a plate-setter and then expose and develop it according to the methods of the present invention.

More specific embodiments of such imaging materials will now be discussed.

The Support

The support of the printing plate precursor may be a sheet-like material such as a plate or it may be a cylindrical element such as a sleeve that can be slid around a print cylinder of a printing press. Alternatively, the support can also be the print cylinder itself. In the latter option, the image-recording layer is provided on the print cylinder, e.g. by on-press spraying as indicated above. The support is preferably a hydrophilic support or a support that is provided with a hydrophilic layer. Preferably, the support is a metal support such as aluminum or stainless steel.

A particularly preferred hydrophilic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate of thin aluminum and plastic. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumna particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. Nos. 3,971,660, and 4,284,705.

It is particularly preferred to use a film support to which an adhesion improving layer, also called subbing layer, has been provided. Particularly suitable adhesion improving layers for use in accordance with the present invention comprise a hydrophilic binder and colloidal silica as disclosed in EP-A- 619 524, EP-A- 620 502 and EP-A- 619 525. Preferably, the amount of silica in the adhesion improving layer is between 200 mg/m$^2$ and 750 mg/m$^2$. Further, the ratio of silica to hydrophilic binder is preferably more than 1 and the surface area of the colloidal silica is preferably at least 300 m$^2$/gram, more preferably at least 500 m$^2$/gram.

Heat-Sensitive Imaging Materials

The imaging mechanism of thermal materials can be triggered by direct exposure to heat, e.g. by means of a thermal head, or by the light absorption of one or more compounds in the coating that are capable of converting light, more preferably infrared light, into heat. Particularly useful light-to-heat converting compounds are for example dyes, pigments, carbon black, metal carbides, borides, nitrides, carbonitrides, bronze-structured oxides, and conductive polymer dispersions such as polypyrrole, polyaniline or polythiophene-based conductive polymer dispersions. Infrared dyes and carbon black are highly preferred.

In a first suitable example of a thermal printing plate precursor, the working mechanism of the coating relies on the heat-induced coalescence of hydrophobic thermoplastic polymer particles, preferably dispersed in a hydrophilic binder, as described in e.g. EP 770 494; EP 770 495; EP 770 497; EP 773 112; EP 774 364; and EP 849 090. Such a material is commercially available from Agfa-Gevaert under the trade name Thermolite.

The coalesced polymer particles define a hydrophobic, printing area that is not readily removable during the development step whereas the unexposed layer defines a non-printing area that is readily removable during the development step. The hydrophobic thermoplastic polymer particles preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. Specific examples of hydrophobic polymer particles are e.g. polyethylene, polyvinyl chloride, polymethyl (meth)acrylate, polyethyl (meth)acrylate, polyvinylidene chloride, polyacrylonitrile, polyvinyl carbazole, polystyrene or copolymers thereof. Most preferably used is polystyrene. The weight average molecular weight of the polymers may range from 5,000 to 1,000,000 g/mol. The hydrophobic particles may have a particle size from 0.01 µm to 50 µm, more preferably between 0.05 µm and 10 µm and most preferably between 0.05 µm and 2 µm. The amount of hydrophobic thermoplastic polymer particles contained in the image forming layer is preferably between 20% by weight and 65% by weight and more preferably between 25% by weight and 55% by weight and most preferably between 30% by weight and 45% by weight.

Suitable hydrophilic binders are for example synthetic homo- or copolymers such as a polyvinylalcohol, a poly (meth)acrylic acid, a poly(meth)acrylamide, a polyhydroxyethyl(meth)acrylate, a polyvinylmethylether or natural binders such as gelatin, a polysaccharide such as e.g. dextran, pullulan, cellulose, arabic gum, alginic acid.

In a second suitable embodiment, the coating comprises an aryldiazosulfonate homo- or copolymer that is hydrophilic and soluble in the processing liquid before exposure and rendered hydrophobic and less soluble after such exposure. The exposure can be done by the same means as discussed above. Alternatively, the aryldiazosulfonate polymer can also be switched by exposure to UV light, e.g. by a UV laser or a UV lamp.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth) acrylamide, acrylonitrile, vinylacetate, vinylchloride, vinylidene chloride, styrene, α-methyl styrene etc. Suitable aryldiazosulfonate polymers for use in the present invention have the following formula:

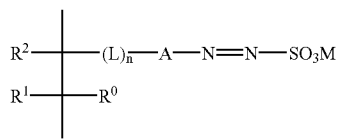

wherein $R^{0,1,2}$ each independently represent hydrogen, an alkyl group, a nitrile or a halogen, e.g. Cl, L represents a divalent linking group, n represents 0 or 1, A represents an aryl group and M represents a cation. L preferably represents divalent linking group selected from the group consisting of $-X_t-CONR^3-$, $-X_t-COO-$, $-X-$ and $-X_t-CO-$, wherein t t represents 0 or 1, $R^3$ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen, sulfur or an aminogroup. A preferably represents an unsubstituted aryl group, e.g. an unsubstituted phenyl group or an aryl group, e.g. phenyl, substituted with one or more alkyl group, aryl group, alkoxy group, aryloxy group or amino group. M preferably represents a cation such as $NH_4^+$ or a metal ion such as a cation of Al, Cu, Zn, an alkaline earth metal or alkali metal.

Suitable aryldiazosulfonate monomers for preparing the above polymers are disclosed in EP-A 339393, EP-A 507008 and EP-A 771645.

A third suitable embodiment of a thermal printing plate is positive working and relies on photo-induced solubilization of a novolac layer. Known examples are Agfa's Thermostar™ and Electra™ from Kodak Polychrome Graphics, of which the composition and working mechanism has been described in e.g. EP-A 864 420, EP-A 908 305, EP-A 908 779, EP-A 908 784, EP-A 908 306, EP-A 908 307, EP-A 950 517, EP-A 950 518, EP-A 825 927, EP-A 823327 and WO99/21725.

Light-Sensitive Imaging Materials

In addition to the above thermal materials, also light-sensitive coatings can be used in the methods of the present invention. Typical examples of plates which are sensitive to visible light work according to the silver salt diffusion transfer reversal mechanism, such as the Lithostar™ plate materials of Agfa-Gevaert, or are based on photopolymerization, e.g. the N90™ and N91™ plate materials, both also available from Agfa-Gevaert, can be used.

In a particular embodiment of the present invention, a conventional, UV-sensitive "PS" plate is used. Suitable examples of such plates, that are sensitive in the range of 300–450 nm (near UV and blue light), have been discussed in EP 1 029 668 A2. More details of positive and negative working compositions that are typically used in "PS" plates will now be discussed in more detail.

The positive working imaging layer preferably comprises an o-naphtoquinonediazide compound (NQD)and an alkali soluble resin. Particularly preferred are o-naphthoquinonediazidosulfonic acid esters or o-naphthoquinone diazidocarboxylic acid esters of various hydroxyl compounds and o-naphthoquinone-diazidosulfonic acid amides or o-naphthoquinone-diazidocarboxylic acid amides of various aromatic amine compounds.

Two variants of NQD systems can be used: one-component systems and two-component systems. In the former case, the sulfonic or carboxyl acid group is linked directly to the phenolic hydroxy group of a water insoluble, alkali soluble or swellable resins having a phenolic hydroxy group. It is preferred that some phenolic hydroxy groups remain unsubstituted. Examples of such compounds include phenol, cresol, resorcinol and pyrogallol. Examples of preferred water insoluble, alkali soluble or swellable resins having a phenolic hydroxy group include phenol-formaldehyde resin, cresol-formaldehyde resin, pyrogallol-acetone resin and resorcinol-benzaldehyde resin. Typical examples include esters napthoquinone-(1,2)-diazidosulfonic acid and phenol-formaldehyde resin or cresol-formaldehyde resin, esters of naphthoquinone-(1,2)-diazido-(2)-5-sulfonic acid and pyrogallol-acetone resin as disclosed in U.S. Pat. No. 3,635,709 and esters of naphthoquinone-(1,2)-diazido-(2)-5-sulfonic acid and resorcinol-pyrogallol-acetone copolycondensates as disclosed in J.P. KOKAI No. Sho 55-76346.

Examples of other useful compounds are polyesters having hydroxyl groups at their termini esterified with o-naphtho-quinone-diazidesulfonyl chloride as disclosed in J.P. KOKAI No. Sho 50-117503; homopolymers of p-hydroxy-styrene or copolymers thereof with other copolymerizable monomers esterified with o-naphtoquinone-diazidosulfonyl chloride as disclosed in J.P. KOKAI No. Sho 50-113305; condensates of alkyl acrylate-acryloyloxyalkyl carbonate-hydroxyalkyl acrylate copolymers with o-naphthoquino-nediazido-sulfonyl chloride as disclosed in U.S. Pat. No. 3,859,099; amides of copolymers of p-aminostyrene and monomers copolymerizable therewith and o-naphthoquino-nediazido-sulfonic acid or o-naphthoquinonediazidocar-boxylic acid as disclosed in U.S. Pat. No. 3,759,711; as well as ester compounds of polyhydroxybenzophenone and o-naphthoquinonediazidosulfonyl chloride.

These compounds may be used alone but are preferably used as a mixture with an alkali-soluble resin to form a light-sensitive layer.

In the application of NQD as two-component systems various low-molecular NQD sulfonic or carboxyl acid derivatives are dissolved mainly in certain water insoluble, alkali soluble or swellable resins; the latter acts as polymeric binder for NQD. Preferably said 4- or 5-sulfonyl or carboxyl substituted 1,2 naphthoquinone-diazides are esters of 1,2 naphthoquinonediazides-4- or -5-sulfonic or carboxylic acids with a phenolic compound having at least two phenolic hydroxy groups, more preferably with a phenolic compound having at least three phenolic hydroxy groups. Further suitable 1,2 naphthoquinone-2-diazides are disclosed in GB-A 739654 and in U.S. Pat. No. 4,266,001.

Preferred water insoluble, alkali soluble or swellable resins are resins, which comprise phenolic hydroxy groups, oxime groups or sulfonamido groups. More preferred are resins having phenolic hydroxy groups, and phenolic hydroxy functionalized derivatives of poly(meth)acrylates, which can be synthesized starting from e.g. hydroxyethyl (meth)acrylate.

Most preferred are synthetic novolac resins and typical examples thereof are phenolformaldehyde resin, cresol-formaldehyde resin, and phenol-cresol-formaldehyde copolycondensed resins as disclosed in J.P. KOKAI No. Sho 55-57841

The negative working layer of a "PS" plate preferably comprises a diazonium salt, a diazonium resin or an aryl-diazosulfonate homo- or copolymer. Examples of low-molecular weight diazonium salts for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodipheny-lamine diazoniumchloride, 4-piperidino aniline diazonium-sulfate, 4-diethylamino aniline diazoniumsulfate and oligomeric condensation products of diazodiphenylamine and formaldehyde. Examples of diazo resins useful in the present invention include condensation products of an aromatic diazonium salt as the light-sensitive substance. Such condensation products are described, for example, in DE-P-1 214 086. The light- or heat-sensitive layer preferably also contains a binder e.g. polyvinyl alcohol.

Upon exposure the diazo resins or diazonium salts are converted from water soluble to water insoluble (due to the destruction of the diazonium groups) and additionally the photolysis products of the diazo may increase the level of crosslinking of the polymeric binder or diazo resin, thereby selectively converting the coating, in an image pattern, from water soluble to water insoluble. The unexposed areas remain unchanged, i.e. water-soluble.

The Exposure Step

The step of image-wise exposure can involve exposure to electromagnetic radiation or to heat, since the method of the present invention is applicable to both light- and heat-sensitive materials. Preferred light-sensitive materials are UV-sensitive, especially UV-sensitive materials which can be handled in daylight. For similar reasons, heat-sensitive materials that can be exposed with a thermal head or infrared radiation are also very suitable. A preferred exposure device comprises one or more lasers such as a He/Ne laser, an Ar lasers or a violet laser diode. Most preferably, the light used for the exposure is UV laser light or a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10–25 µm), the scan speed and the resolution of the exposure apparatus (i.e. the number of addressable pixels per unit of linear distance, often expressed in dots per inch or dpi; typical value: 1000–4000 dpi). Also UV lamps, preferably digitally modulated, e.g. by means of light valves or a digital mirror device, can be used.

The Development Step

According to the present invention, an image-wise exposed lithographic printing plate precursor is developed by supplying a processing liquid by means of the dampening system that is present in the known printing units of a lithographic printing press. FIG. 1 shows a typical example of such a unit comprising a plate cylinder 1, a blanket cylinder 2, an impression cylinder 3, an inking system 5 and a dampening system 6. In the embodiment of FIG. 1, processing liquid 8 is supplied from fountain pan 7 via dampening rollers to the coating of the printing plate precursor, preferably without engaging the inking system, during one or more revolutions of the plate cylinder 1 that carries the plate precursor (not shown). After optional rinsing or other optional processing steps, discussed below, the inking system 5 may be engaged and driographic ink or single-fluid ink 9 is thereby supplied from ink duct 10 to the printing plate. The ink is then image-wise transferred via blanket cylinder 2 to paper 4, which can be fed through the press in sheet—or in web-form.

The development step may comprise an additional step wherein a rinsing liquid is supplied to the plate, e.g. water, and an optional drying step, e.g. by applying hot air or by using infrared lamps. The development step may also be preceded by a pre-treatment such as soaking the layer(s) of the imaging material with water or another liquid. The rinsing and pre-treatment liquid may comprise additives, e.g. compounds for adjusting the surface tension of the liquid. These liquids may be applied by the same dampening system as the processing liquid.

The processing liquid and/or the rinsing liquid is preferably collected from the plate with a suction device that collects the liquid from the material together with substances removed from the developed coating. The suction device can be engaged simultaneously with the application of processing liquid or after a time period of preferably at least 10 seconds, more preferably between 20 and 90 seconds, during which the processing liquid attacks the coating. The suction device can simply be a porous material, e.g. a liquid-absorbing cloth or fabric in sheet—or web-form. Such porous material can be supplied from a roll and, after contacting the coating of the plate material, be wound up on another roll. The collection of processing and/or rinsing liquid can also be carried out with a vacuum apparatus. Such an apparatus is preferred over the use of a porous material since it reduces the risk of Tinting of clothes and the risk of mechanical damage or contamination of the lithographic support. A suitable vacuum apparatus has been described in EP-A no. 01000004.0, filed on 06.02.2001. The collected processing and/or rinsing liquid may be recycled and reused for the processing and rinsing of a next imaging material.

A preferred processing liquid is an aqueous alkaline solution, having a pH in the range 7.5–14. The processing can be achieved by chemical as well as mechanical effects. Both effects are preferably combined, e.g. by treating the coating with a rotating brush during or after the application of processing liquid. Other suitable mechanical treatments may involve rubbing or ultrasonic treatment. Mechanical treatment is advantageous since it provides the possibility to reduce the chemical reactivity of the processing liquid, e.g. to reduce the pH or the temperature thereof.

The Single-Fluid Ink

Single-fluid inks that are suitable for use in the method of the present invention have been described in U.S. Pat. Nos. 4,045,232 and 4,981,517. In a most preferred embodiment, the single fluid ink comprises an ink phase, also called the hydrophobic or oleophilic phase, and a polyol phase as described in WO 00/32705, of which the relevant content is reproduced hereinafter.

The hydrophobic phase preferably comprises a vinyl resin having carboxyl functionality. The term "vinyl resin" includes polymers prepared by chain reaction polymerization, or addition polymerization, through carbon-carbon double bonds, using vinyl monomers and monomers copolymerizable with vinyl monomers. Typical vinyl monomers include, without limitation, vinyl esters, acrylic and methacrylic monomers, and vinyl aromatic monomers including styrene. The vinyl polymers may be branched by including in the polymerization reaction monomers that have two reaction sites. When the vinyl polymer is branched, it nonetheless remains usefully soluble. By "soluble" it is meant that the polymer can be diluted with one or more solvents. (By contrast, polymers may be crosslinked into insoluble, three-dimensional network structures that are only be swelled by solvents.) The branched vinyl resins retain solvent dilutability in spite of significant branching.

The carboxyl-functional vinyl polymers may be prepared by polymerization of a monomer mixture that includes at least one acid-functional monomer or at least one monomer that has a group that is converted to an acid group following polymerization, such as an anhydride group. Examples of acid-functional or anhydride-functional monomers include, without limitation, α,β-ethylenically unsaturated monocarboxylic acids containing 3 to 5 carbon atoms such as acrylic, methacrylic, and crotonic acids; α,β-ethylenically unsaturated dicarboxylic acids containing 4 to 6 carbon atoms and the anhydrides and monoesters those acids, such as maleic anhydride, and fumaric acid; and acid-functional derivatives of copolymerizable monomers, such as the hydroxylethyl acrylate half-ester of succinic acid.

It is preferred to include an acid-functional monomer such as acrylic acid, methacrylic acid, or crotonic acid, or an anhydride monomer such as maleic anhydride or itaconic anhydride that may be hydrated after polymerization to generate acid groups. It is preferred for the acid-functional vinyl polymer to have an acid number of at least about 3 mg KOH per gram nonvolatile, preferably an acid number of from about 6 to about 30 mg KOH per gram nonvolatile, and more preferably an acid number of from about 8 to about 25 mg KOH per gram nonvolatile, based upon the nonvolatile weight of the vinyl polymer.

In a preferred embodiment, the acid-functional polymers are significantly branched. The inks used in the present invention preferably include a vinyl polymer that is branched but usefully soluble. The branched vinyl polymers may be diluted, rather than swollen, by addition of solvent. The branching may be accomplished by at least two methods. In a first method, a monomer with two or more polymerizable double bonds is included in the polymerization reaction. In a second method, a pair of ethylenically unsaturated monomers, each of which has in addition to the polymerizable double bond at least one additional functionality reactive with the additional functionality on the other monomer, are included in the monomer mixture being polymerized. Preferably, the reaction of the additional functional groups takes place during the polymerization reaction, although this is not seen as critical and the reaction of the additional functional groups may be carried out partially or wholly before or after polymerization. A variety of such pairs of mutually reactive groups are possible. Illustrative examples of such pairs of reactive groups include, without limitation, epoxide and carboxyl groups, amine and carboxyl groups, epoxide and amine groups, epoxide and anhydride groups, amine and anhydride groups, hydroxyl and carboxyl or anhydride groups, amine and acid chloride groups, alkylene-imine and carboxyl groups, organoalkoxysilane and carboxyl groups, isocyanate and hydroxyl groups, cyclic carbonate and amine groups, isocyanate and amine groups, and so on. When carboxyl or anhydride groups are included as one of the reactive groups, they are used in a sufficient excess to provide the required carboxyl functionality in the vinyl resin. Specific examples of such monomers include, without limitation, glycidyl (meth)acrylate with (meth) acrylic acid, N-alkoxymethylated acrylamides (which react with themselves) such as N-isobutoxymethylated acrylamide, gamma-methacryloxytrialkoxysilane (which reacts with itself), and combinations thereof.

Preferably, the vinyl resin is polymerized using at least one monomer having two or more polymerizable ethylenically unsaturated bonds, and particularly preferably from two to about four polymerizable ethylenically unsaturated bonds. Illustrative examples of monomers having two or more ethylenically unsaturated moieties include, without limitation, (meth)acrylate esters of polyols such as 1,4-butanediol di(meth)acrylate, 1.6-hexanediol di(meth)acrylate, neopentyl glycol di(meth)acrylate, trimethylol propane tri(meth)acrylate, tetramethylol methane tetra(meth)acrylate, pentaerythritol tetra(meth)acrylate, dipentaerythritol penta(meth)acrylate, dipentaerythritol hexa(meth)acrylate, alkylene glycol di(meth)acrylates and polyalkylene glycol di(meth)acrylates, such as ethylene glycol di(meth)acrylate, butylene glycol di(meth)acrylate, diethylene glycol di(meth) acrylate, triethylene glycol di(meth)acrylate, and polyethylene glycol di(meth)acrylate; divinylbenzene, allyl methacrylate, diallyl phthalate, diallyl terephthalate, and the like, singly or in combinations of two or more. Of these, divinylbenzene, butylene glycol dimethacrylate, butanediol dimethacrylate, trimethylolpropane triacrylate, and pentaerythritol tetra-acrylate are highly preferred, and divinylbenzene is still more highly preferred.

Preferably, the branched vinyl polymer is polymerized using at least about 0.008 equivalents per 100 grams of monomer polymerized of at least one monomer having at least two ethylenically unsaturated polymerizable bonds, or 0.004 equivalents per 100 grams of monomer polymerized of each of two monomers having mutually reactive groups in addition to an ethylenically unsaturated polymerizable bond. Preferably, the branched vinyl polymer is polymerized using from about 0.012 to about 0.08 equivalents, and more preferably from about 0.016 to about 0.064 equivalents per 100 grams of monomer polymerized of the polyfunctional monomer or monomers having at least two ethylenically unsaturated polymerizable bonds or of the pair of monomers having one polymerization bond and one additional mutually reactive group.

The polyfunctional monomer or monomers preferably have from two to four ethylenically unsaturated polymerizable bonds, and more preferably two ethylenically unsaturated polymerizable bonds. In one embodiment it is preferred for the branched vinyl resin to be prepared by polymerizing a mixture of monomers that includes from about 0.5% to about 6%, more preferably from about 1.2% to about 6%, yet more preferably from about 1.2% to about 4%, and even more preferably from about 1.5% to about 3.25% divinylbenzene based on the total weight of the monomers polymerized. (Commercial grades of divinylbenzene include mono-functional and/or non-functional material. The amount of the commercial material needed to provide the indicated percentages must be calculated. For example, 5% by weight of a material that is 80% by weight divinylbenzene/20% mono-functional monomers would provide 4% by weight of the divinylbenzene fraction.)

The optimum amount of (1) divinylbenzene or other monomer having at least two polymerizable ethylenically unsaturated bond or (2) pair of monomers having polymerizable group and additional, mutually-reactive groups that are included in the polymerization mixture depends to some extent upon the particular reaction conditions, such as the rate of addition of monomers during polymerization, the solvency of the polymer being formed in the reaction medium chosen, the amount of monomers relative to the reaction medium, the half-life of the initiator chosen at the reaction temperature and the amount of initiator by weight of the monomers, and may be determined by straightforward testing.

Other monomers that may be polymerized along with the polyfunctional monomers and the acid-functional monomers (or monomers with groups that can later be converted to acid groups) include, without limitation, esters of $\alpha,\beta$-ethylenically unsaturated monocarboxylic acids containing 3 to 5 carbon atoms such as esters of acrylic, methacrylic, and crotonic acids; $\alpha,\beta$-ethylenically unsaturated dicarboxylic acids containing 4 to 6 carbon atoms and the anhydrides, monoesters, and diesters of those acids; vinyl esters, vinyl ethers, vinyl ketones, and aromatic or heterocyclic aliphatic vinyl compounds. Representative examples of suitable esters of acrylic, methacrylic, and crotonic acids include, without limitation, those esters from reaction with saturated aliphatic and cycloaliphatic alcohols containing 1 to 20 carbon atoms, such as methyl, ethyl, propyl, isopropyl, n-butyl, isobutyl, tert-butyl, 2-ethylhexyl, lauryl, stearyl, cyclohexyl, trimethylcyclohexyl, tetrahydrofurfuryl, stearyl, sulfoethyl, and isobornyl acrylates, methacrylates, and crotonates; and polyalkylene glycol acrylates and methacrylates. Representative examples of other ethylenically unsaturated polymerizable monomers include, without limitation, such compounds as fumaric, maleic, and itaconic anhydrides, monoesters, and diesters with alcohols such as methanol, ethanol, propanol, isopropanol, butanol, isobutanol, and tert-butanol. Representative examples of polymerization vinyl monomers include, without limitation, such compounds as vinyl acetate, vinyl propionate, vinyl ethers such as vinyl ethyl ether, vinyl and vinylidene halides, and vinyl ethyl ketone. Representative examples of aromatic or heterocyclic aliphatic vinyl compounds include, without limitation, such compounds as styrene, $\alpha$-methyl styrene, vinyl toluene, tert-butyl styrene, and 2-vinyl pyrrolidone. The selection of monomers is made on the basis of various factors commonly considered in making ink varnishes, including the desired glass transition temperature and the desired dilutability of the resulting polymer in the solvent or solvent system of the ink composition.

The preferred vinyl polymers may be prepared by using conventional techniques, preferably free radical polymerization in a semi-batch process. For instance, the monomers, initiator(s), and any chain transfer agent may be fed at a controlled rate into a suitable heated reactor charged with solvent in a semi-batch process. Typical free radical sources are organic peroxides, including dialkyl peroxides, such as di-tert-butyl peroxide and dicumyl peroxide, peroxyesters, such as tert-butyl peroxy 2-ethylhexanoate and tert-butyl peroxy pivalate; peroxy carbonates and peroxydicarbonates, such as tert-butyl peroxy isopropyl carbonate, di-2-ethylhexyl peroxydicarbonate and dicyclohexyl peroxydicarbonate; diacyl peroxides, such as dibenzoyl peroxide and dilauroyl peroxide; hydroperoxides, such as cumene hydroperoxide and tert-butyl hydroperoxide; ketone peroxides, such as cyclohexanone peroxide and methylisobutyl ketone peroxide; and peroxyketals, such as 1,1-bis(tert-butyl peroxy)-3,5,5-trimethylcyclohexane and 1,1-bis(tert-butyl peroxy)cyclohexane; as well as azo compounds such as 2,2'-azobis(2-methylbutanenitrile), 2,2'-azobis(2-methyl) propionitrile, and 1,1'-azobis(cyclohexanecarbonitrile). Organic peroxides are preferred. Particularly preferred is tert-butyl peroxy isopropyl carbonate. Chain transfer agents may also be used in the polymerization. Typical chain transfer agents are mercaptans such as octyl mercaptan, n- or tert-dodecyl mercaptan, thiosalicylic acid, mercaptocarboxylic acids such as mercaptoacetic acid and mercaptopropionic acid and their esters, and mercaptoethanol; halogenated compounds; and dimeric $\alpha$-methyl styrene. Preferably, no chain transfer agent is included because of odor and other known drawbacks. The particular initiator and amount of initiator used depends upon factors known to the person skilled in the art, such as the reaction temperature, the amount and type of solvent (in the case of a solution polymerization), the half-life of the initiator, and so on.

The addition polymerization is usually carried out in solution at temperatures from about 20° C. to about 300° C., preferably from about 150° C. to about 200° C., more preferably from about 160° C. to about 165° C. Preferably, the polymerization is carried out with approximately the same reaction temperature and using the same initiator(s) throughout. The initiator should be chosen so its half-life at the reaction temperature is preferably no more than about thirty minutes, particularly preferably no more than about five minutes, and yet more preferably no more than about two minutes. Particularly preferred are initiators having a half-life of less than about one minute at a temperature of from about 150° C. to about 200° C. In general, more of the branching monomer can be included when the initiator half-life is shorter and/or when more initiator is used. The vinyl polymer vehicles used in the ink preferably have little or no residual (unreacted) monomer content. In particular, the vinyl vehicles are preferably substantially free of residual monomer, i.e., have less than about 0.5% residual monomer, and even more preferably less than about 0.1% residual monomer by weight, based on the total weight of the monomers being polymerized.

In a semi-batch process, the monomer and initiator is added to the polymerization reactor over a period of time, preferably at a constant rate. Typically, the add times are from about 1 to about 10 hours, and add times of from about three to about five hours are common. Longer add times typically produce lower number average molecular weights. Lower number average molecular weights may also be produced by increasing the ratio of solvent to monomer or by using a stronger solvent for the resulting polymer.

In general, the branched vinyl polymer used in the ink has a low number average molecular weight and a broad polydispersity. The number average molecular weight and weight average molecular weight of a vinyl resin used in the ink can be determined by gel permeation chromatography using polystyrene standards, which are available for up to 6 million weight average molecular weight, according to well-accepted methods. Polydispersity is defined as the ratio of $M_w/M_n$. In a preferred embodiment, the vinyl polymer has a number average molecular weight ($M_n$) of at least about 1000, and more preferably at least about 2000. The number average molecular weight is also preferably less than about 15,000, more preferably less than about 10,000, and even more preferably less than about 8500. A preferred range for $M_n$ is from about 1000 to about 10,000, a more preferred range for $M_n$ is from about 2000 to about 8500, and an even more preferred range is from about 4000 to about 8000. The weight average molecular weight should be at least about 30,000, preferably at least about 100,000. The weight average molecular weight ($M_w$) is preferably up to about 60 million, based upon a GPC determination using an available standard having 6 million weight average molecular weight. A preferred range for $M_w$ is from about 30,000 to about 55 million, a more preferred range for $M_w$ is from about 100,000 to about 1 million, and a still more preferred range is from about 100,000 to about 300,000. Resins having ultra-high molecular weight shoulders (above about 45 million), that can be seen by GPC, are preferably avoided for the $M_w$ range of from about 100,000 to about 300,000. The polydispersity, or ratio of $M_w/M_n$, may be up to about 10,000, preferably up to about 1000. The polydispersity is preferably at least about 15, particularly preferably at least about 50. The polydispersity preferably falls in the range of from about 15 to about 1000, and more preferably it falls in a range of from about 50 to about 800.

The theoretical glass transition temperature can be adjusted according to methods well-known in the art through selection and apportionment of the commoners. In a preferred embodiment, the theoretical $T_g$ is above room temperature, and preferably the theoretical $T_g$ is at least about 60° C., more preferably at least about 70° C. The methods and compositions of the present invention preferably employ vinyl polymers having a $T_g$ of from about 50° C. to about 125° C., more preferably from about 60° C. to about 100° C., and even more preferably from about 70° C. to about 90° C.

In one embodiment of the single-fluid ink, the acid-functional vinyl polymer, which may be a branched vinyl polymer, is combined with other resins in the ink composition. Examples of suitable other resins that may be combined with the acid-functional vinyl polymer include, without limitation, polyester and alkyd resins, phenolic resins, rosins, cellulosics, and derivatives of these such as rosin-modified phenolics, phenolic-modified rosins, hydrocarbon-modified rosins, maleic modified rosin, fumaric modified rosins; hydrocarbon resins, other acrylic or vinyl resins, polyamide resins, and so on. Such resins or polymers may be included in amounts of up to about 6 parts by weight to about 1 part by weight of the acid-functional vinyl polymer, based upon the nonvolatile weights of the resins.

In addition to the acid-functional vinyl resin and any optional second resin, the ink compositions preferably include one or more solvents. In a preferred embodiment of the single-fluid ink, the branched vinyl resin forms a solution or apparent solution having no apparent turbidity in the solvent or solvents of the ink formulation. The particular solvents and amount of solvent included is determined by the ink viscosity, body, and tack desired. In general, non-oxygenated solvents or solvents with low Kauri-butanol (KB) values are used for inks that will be in contact with rubber parts such as rubber rollers during the lithographic process, to avoid affecting the rubber. Suitable solvents for inks that will contact rubber parts include, without limitation, aliphatic hydrocarbons such as petroleum distillate fractions and normal and iso paraffinic solvents with limited aromatic character. For example, petroleum middle distillate fractions such as those available under the tradename Magie Sol, available from Magie Bros. Oil Company, a subsidiary of Pennsylvania Refining Company, Franklin Park, Ill., under the tradename ExxPrint, available from Exxon Chemical Co., Houston, Tex., and from Golden Bear Oil Specialties, Oildale, Calif., Total Petroleum Inc., Denver, Colo., and Calumet Lubricants Co., Indianapolis, Ind. may be used. In addition or alternatively, soybean oil or other vegetable oils may be included.

When non-oxygenated solvents such as these are used, it is generally necessary to include a sufficient amount of at least one monomer having a substantial affinity for aliphatic solvents in order to obtain the desired solvency of the preferred branched vinyl polymer. In general, acrylic ester monomers having at least six carbons in the alcohol portion of the ester or styrene or alkylated styrene, such as tert-butyl styrene, may be included in the polymerized monomers for this purpose. In a preferred embodiment, an ink composition with non-oxygenated solvents includes a branched vinyl resin polymerized from a monomer mixture including at least about 20%, preferably from about 20% to about 40%, and more preferably from about 20% to about 25% of a monomer that promotes aliphatic solubility such as stearyl methacrylate or t-butyl styrene, with stearyl methacrylate being a preferred such monomer. It is also preferred to include at least about 55% percent styrene, preferably from about 55% to about 80% styrene, and more preferably from about 60% to about 70% styrene. Methyl methacrylate or other monomers may also be used to reduce solvent tolerance in aliphatic solvent, if desired. All percentages are by weight, based upon the total weight of the monomer mixture polymerized. Among preferred monomer compositions for vinyl polymers for lithographic inks are those including a (meth)acrylic ester of an alcohol having 8–20 carbon atoms such as stearyl methacrylate, styrene, divinylbenzene, and (meth)acrylic acid. In a preferred embodiment, a branched vinyl for a lithographic printing ink is made with from about 15, preferably about 20, to about 30, preferably about 25, weight percent of a (meth)acrylic ester of an alcohol having 8–20 carbon atoms, especially stearyl methacrylate; from about 50, preferably about 60, to about 80, preferably about 75, weight percent of a styrenic monomer, especially styrene itself; an amount of divinylbenzene as indicated above; and from about 0.5, preferably about 2.5, to about 5, preferably about 4, weight percent of acrylic acid or, more preferably, of methacrylic acid.

Preferably, the solvent or solvent mixture will have a boiling point of at least about 100° C. and preferably not more than about 550° C. Offset printing inks may use solvents with boiling point above about 200° C. News inks usually are formulated with from about 20 to about 85 percent by weight of solvents such as mineral oils, vegetable oils, and high boiling petroleum distillates. The amount of solvent also varies according to the type of ink composition (that is, whether the ink is for newsprint, heatset, sheetfed, etc.), the specific solvents used, and other factors known in the art. Typically the solvent content for lithographic inks is up to about 60%, which may include oils as part of the solvent package. Usually, at least about 35% solvent is present in lithographic ink. When used to formulate the preferred single-fluid ink compositions, these varnishes or vehicles, including the branched vinyl resins, are typically clear, apparent solutions.

The ink compositions will usually include one or more pigments. The number and kinds of pigments will depend upon the kind of ink being formulated. News ink compositions typically will include only one or only a few pigments, such as carbon black, while gravure inks may include a more complicated pigment package and may be formulated in many colors, including colors with special effects such as pearlescence or metallic effect. Lithographic printing inks are typically used in four colors—magenta, yellow, black, and cyan, and may be formulated for pearlescence or metallic effect. Any of the customary inorganic and organic pigments may be used in the ink compositions of the present invention. Alternatively, the compositions may be used as overprint lacquers or varnishes. The overprint lacquers (air drying) or varnishes (curing) are intended to be clear or transparent and thus opaque pigments are not included.

Lithographic ink compositions used in the invention are formulated as single-fluid inks having an oil-based continuous phase that contains the acid-functional vinyl vehicle and a polyol discontinuous phase that contains a liquid polyol. The vinyl polymer phase is relatively stable toward the polyol phase. The stability is such that the two phases do not separate in the fountain. During application of the ink, however, the emulsion breaks and the polyol comes to the surface, wetting out the areas of the plate that are not to receive ink. Inks that are stable in the fountain but break quickly to separate on the plate print cleanly without toning and provide consistent transfer characteristics. Proper stability also may depend upon the particular acid-functional vinyl polymer and the particular polyol chosen. The acid number and molecular weight may be adjusted to provide the desired stability.

Higher acid number vinyl resins can be used in lower amounts, but the acid number cannot be excessively high or else the vinyl polymer will not be sufficiently soluble in the hydrocarbon solvent. In general, it is believed that an increase in acid number of the acid-functional vinyl resin should be accompanied by a decrease in the amount of such resin included in the hydrophobic phase.

Polyethylene glycol oligomers such as diethylene glycol, triethylene glycol, and tetraethylene glycol, as well as ethylene glycol, propylene glycol, and dipropylene glycol, are examples of liquid polyols that are preferred for the polyol phase of the single-fluid ink used in the invention. The polyol phase may, of course, include mixtures of different liquid polyols. In general, lower acid number vinyl or acrylic polymers are used with higher molecular weight polyols.

The polyol phase may include further materials. A weak acid such as citric acid, tartaric acid, or tannic acid, or a weak base such as triethanolamine, may be included in an amount of from about 0.01 weight percent up to about 2 weight percent of the ink composition. Certain salts such as magnesium nitrate may be included in amounts of from about 0.01 weight percent to about 0.5 weight percent, preferably from about 0.08 to about 1.5 weight percent, based on the weight of the ink composition, to help protect the plate and extend the life of the plate. A wetting agent, such as polyvinylpyrolidone, may be added to aid in wetting of the plate. From about 0.5 weight percent to about 1.5 weight percent of the polyvinylpyrollidone is included, based on the weight of the ink composition.

Single-fluid inks may be formulated with from about 5% to about 50%, preferably from about 10% to about 35%, and particularly preferably from about 20% to about 30% of polyol phase by weight based on the total weight of the ink composition. Unless another means for cooling is provided, there is preferably a sufficient amount of polyol in the ink composition to keep the plate at a workably cool temperature. The amount of polyol phase necessary to achieve good toning and printing results depends upon the kind of plate being used and may be determined by straightforward testing. Up to about 4 or 5% by weight of water may be included in the polyol phase mixture to aid in dissolving or homogenizing the ingredients of the polyol phase.

It will be appreciated by the skilled artisan that other additives known in the art that may be included in the ink compositions used in the invention, so long as such additives do not significantly detract from the benefits of the present invention. Illustrative examples of these include, without limitation, pour point depressants, surfactants, wetting agents, waxes, emulsifying agents and dispersing agents, defoamers, antioxidants, UV absorbers, dryers (e.g., for formulations containing vegetable oils), flow agents and other rheology modifiers, gloss enhancers, and anti-settling agents. When included, additives are typically included in amounts of at least about 0.001% of the ink composition, and may be included in amount of about 7% by weight or more of the ink composition.

The compositions described above are particularly suited for use in lithographic applications, including, without limitation, as heatset inks, news inks, and sheetfed inks. Offset printing processes in which the inks may be used are well-known in the art and are described in many publications.

EXAMPLES

Preparation of a Heatset Single-Fluid Ink

1. Preparation of a Vinyl Varnish

An amount of 44.19 parts by weight of Ketrul 220 (a petroleum middle distillate fraction available from Total Petroleum, Inc.) is charged to a glass reactor equipped with stirrer, nitrogen inlet, total reflux condenser, and monomer inlet. The solvent is heated to 160° C. with stirring under a blanket of nitrogen. A monomer mixture of 36.01 parts by weight styrene, 12.27 parts by weight stearyl methacrylate, 2.62 parts by weight divinylbenzene, 1.89 parts by weight methacrylic acid, and 2.79 parts by weight t-butyl peroxy isopropyl carbonate (75% solution in mineral spirits) is added to the reactor over a period of three hours. After the monomer addition is complete, 0.23 parts by weight of t-butyl peroxy isopropyl carbonate is added over a period of fifteen minutes. The temperature is held at 160° C. for an additional two hours to allow for complete conversion of the monomer to polymer.

The measured amount of non-volatile matter (NVM) is 55%. The percent conversion, measured as NVM divided by the percent of the total weight of monomers, is 100.1. The acid number on solution is 12.0 mg KOH per gram. The viscosity is 30 Stokes (bubble tube, 54.4° C.). The solvent tolerance is 230% and the NVM at cloud point is 16.7%.

2. Preparation of Single-Fluid Ink 58.0 grams of the following Mixture A is added to 142.0 grams of the following Mixture B with stirring. The ink composition is mixed for 20 minutes on a dispersator, maintaining a vortex and holding the temperature under 60° C. The ink composition has a single fall time Laray of 14 to 17 seconds for 500 grams at 30° C.

Mixture A: Mix in a glass beaker until clear 181.0 grams of diethylene glycol, 8.0 grams of water, 0.4 grams of citric acid, and 0.4 grams of magnesium nitrate. Add 191.2 grams of diethylene glycol and mix until homogenous.

Mixture B: Mix, using a high-speed mixer, 46.0 grams of the above Vinyl Varnish, 4.0 grams of Blue Flush 12-FH-320 (available from CDR Corporation, Elizabethtown, Ky.) 1.0 gram technical grade Soy oil (available from Cargill, Chicago, Ill.) and 0.6 grams of an antioxidant. While mixing, add 34.4 grams of a hydrocarbon resin solution (60% LX-2600 in EXX-Print 283D, available from Neville), 27.0 grams of a carbon black (CSX-156 available from Cabot Corp.), and 1.0 gram of a polytetrafluoroethylene wax (Pinnacle 9500D, available from Carrol Scientific). Mix at a high speed for 30 minutes at 149° C. Slow the mixing speed and add 27.0 grams of EXX-Print 588D (available from Exxon). Mill the premix in a shot mill to a suitable grind.

Mixture B has a Laray viscosity of 180 to 240 poise and a Laray yield of 800 to 1200 (according to test method ASTM D4040: Power Law-3 k, 1.5 k, 0.7 k, 0.3 k). Mixture B is tested on the Inkometer for one minute at 1200 rpm for a measured result of 25 to 29 units.

Exposure and Processing of Plate Precursors

As a comparative example, two commercially available lithographic plate materials, which require alkaline processing, were image-wise exposed and developed in a conventional processor:

Thermostar™ P970, a positive working thermal material from Agfa-Gevaert, was exposed in a Creo Trendsetter™ 3244T at 140 rpm with a power setting of 5.4 Watt and developed with EP26 in an Autolith™ processor, both available from Agfa-Gevaert.

N61, a negative working UV-sensitive "PS" plate from Agfa-Gevaert, was exposed in a CDL1502i UV contact imager at intensity 600E level 3, and developed with EN232 developer in an Autolith processor (all materials from Agfa-Gevaert).

In a second set of experiments, both these materials were also processed according to the invention by mounting the plate precursors, exposed as above, on a plate cylinder of a Heidelberg GTO46 printing press and then applying the same developer as used in the comparative examples by means of the dampening system. After processing, each plate was also rinsed by wiping with water.

Printing

The comparative plates, that had been conventionally processed, were mounted on a GTO46 press and a press run of 5000 copies was started using K+E 800 Skinnex ink and Combifix 4% from Hostman Steinberg with 10% isopropanol in water as dampening liquid.

A press run of 5000 copies was also started using the plates that were on-press developed according to the invention via the dampening system. During printing, the above described single-fluid ink was used without a dampening liquid.

The print quality of the plates was evaluated by measuring the dot gain of 10%, 40% and 70% screen planes. Also toning (ink acceptance in non-image areas) was evaluated and a general visual inspection of the quality of the printed copies was made. The processing methods according to the invention produced plates with a quality that was very comparable with the conventionally processed plates.

The invention claimed is:

1. A method of printing comprising the steps of
   (i) providing a lithographic printing plate precursor comprising a support and a heat- or light-sensitive coating;
   (ii) image-wise exposing the coating to heat or light;
   (iii) prior to step (ii) or (iv), mounting the lithographic printing plate precursor in a printing unit of a printing press, said printing unit comprising a plate cylinder onto which the precursor is mounted, an inking system adjacent the plate cylinder and a processing liquid system adjacent the plate cylinder comprising one or more rollers for supplying a processing liquid onto the coating while the lithographic printing plate precursor is mounted on the plate cylinder;
   (iv) developing the printing plate precursor while the plate precursor is mounted on the plate cylinder by supplying processing liquid to the precursor coating by means of the one or more rollers, thereby obtaining a lithographic printing plate; and
   (v) printing by supplying single-fluid ink to the lithographic printing plate by means of the inking system, wherein the inking system is adjacent the plate cylinder during at least step (iv).

2. A method according to claim 1 wherein during step (ii) the lithographic printing plate precursor is exposed to ultraviolet or infrared light.

3. A method according to claim 2 wherein the support has a hydrophilic surface, or is provided with a hydrophilic layer, and wherein the coating is hydrophobic or is rendered hydrophobic by the exposure.

4. A method according to claim 1 wherein the support has a hydrophilic surface, or is provided with a hydrophilic layer, and wherein the coating is hydrophobic or is rendered hydrophobic by the exposure.

5. A method according to claim 1 wherein the processing liquid is an aqueous alkaline solution.

6. A method according to claim 1 wherein the coating is mechanically rubbed or brushed during or after the development step.

7. A method according to claim 6 wherein the coating is mechanically rubbed during or after the development step.

8. A method according to claim 1 wherein between step (iv) and (v) the lithographic printing plate is rinsed by supplying water or an aqueous solution.

9. A method according to claim 8 wherein during step (ii) the lithographic printing plate precursor is exposed to ultraviolet or infrared light.

10. A method according to claim 8 wherein the support has a hydrophilic surface, or is provided wit a hydrophilic layer, and wherein the coating is hydrophobic or is rendered hydrophobic by the exposure.

11. A method according to claim 8 wherein the processing liquid is an aqueous alkaline solution.

12. A method according to claim 8 wherein the coating is mechanically rubbed or brushed during or after the development step.

13. A method according to claim 8 wherein the processing liquid and any substances removed from the coating are collected by a suction device.

14. A method according to claim 8 wherein the single-fluid ink is an emulsion comprising a continuous phase comprising an acid-functional vinyl resin and a discontinuous phase comprising a liquid polyol.

15. A method according to claim 1 wherein the processing liquid and any substances removed from the coating are collected by a suction device.

16. A method according to claim 15 wherein the suction device is a liquid-absorbing cloth or fabric.

17. A method according to claim 1 wherein the single-fluid ink is an emulsion comprising a continuous phase comprising an acid-functional vinyl resin and a discontinuous phase comprising a liquid polyol.

18. A method of printing comprising the steps of
  (i) providing a lithographic printing plate precursor comprising a support and a heat- or light-sensitive coating; image-wise exposing the coating to heat or light;
  (iii) prior to step (ii) or (iv), mounting the lithographic printing plate precursor in a printing unit of a printing press, said printing unit comprising a plate cylinder onto which the precursor is mounted, a blanket cylinder in contact with said plate cylinder, an inking system adjacent the plate cylinder and a processing liquid system adjacent the plate cylinder comprising one or more rollers for supplying a processing liquid onto the coating while the lithographic printing plate precursor is mounted on the plate cylinder;
  (iv) developing the printing plate precursor while the plate precursor is mounted on the plate cylinder while the plate cylinder is in contact with the blanket cylinder by supplying processing liquid to the precursor coating by means of The one or more rollers, thereby obtaining a lithographic printing plate; and
  (v) printing by supplying single-fluid ink to the lithographic printing plate by means of the inking system.

* * * * *